(12) United States Patent
Ford et al.

(10) Patent No.: US 12,012,752 B2
(45) Date of Patent: *Jun. 18, 2024

(54) SHIELDED ENCLOSURES AND RELATED METHODS FOR PROTECTION FROM HIGH-ALTITUDE ELECTROMAGNETIC PULSES

(71) Applicants: Hepburn and Sons LLC, Manassas, VA (US); Jaxon Engineering and Maintenance, Inc., Colorado Springs, CO (US)

(72) Inventors: Thomas Benjamin Ford, Midland City, AL (US); Matthew Janish, Eibert, CO (US)

( * ) Notice: Subject to any disclaimer, the term of this patent is extended or adjusted under 35 U.S.C. 154(b) by 89 days.

This patent is subject to a terminal disclaimer.

(21) Appl. No.: 17/358,710

(22) Filed: Jun. 25, 2021

(65) Prior Publication Data
US 2022/0412077 A1 Dec. 29, 2022

(51) Int. Cl.
| | |
|---|---|
| *E04B 1/92* | (2006.01) |
| *E04B 1/08* | (2006.01) |
| *E04B 2/00* | (2006.01) |
| *E04B 5/02* | (2006.01) |
| *E04C 2/08* | (2006.01) |
| *E04C 2/32* | (2006.01) |
| *G01N 27/72* | (2006.01) |
| *H05K 9/00* | (2006.01) |

(52) U.S. Cl.
CPC .............. *E04B 1/92* (2013.01); *E04B 1/08* (2013.01); *E04C 2/08* (2013.01); *E04C 2/322* (2013.01); *E04C 2/46* (2013.01); *E04C 2/50* (2013.01); *G01N 27/72* (2013.01); *H05K 9/0003* (2013.01); *E04B 2001/925* (2013.01); *E04B 2103/06* (2013.01)

(58) Field of Classification Search
CPC ........ E04B 1/08; E04B 1/92; E04B 2001/925; E04B 2103/06; E04C 2/08; E04C 2/46; E04C 2/50; E04C 2/322; G01N 27/72; H05K 9/0003
USPC ........................................... 52/173.1
See application file for complete search history.

(56) References Cited

U.S. PATENT DOCUMENTS

| | | | | |
|---|---|---|---|---|
| 3,092,218 | A * | 6/1963 | Clay | H05K 9/0015 250/517.1 |
| 3,217,085 | A * | 11/1965 | Lindgren | H05K 9/0001 174/371 |
| 4,823,523 | A * | 4/1989 | Coupard | E04B 1/24 52/33 |
| 6,282,848 | B1 * | 9/2001 | Schlapfer | H05K 9/0001 52/480 |
| 10,765,045 | B1 * | 9/2020 | Hector | H05K 9/0003 |
| 10,853,460 | B2 * | 12/2020 | Crawford | H05K 7/183 |
| 11,252,850 | B1 * | 2/2022 | Rodgers | E06B 7/205 |
| 2014/0109495 | A1 * | 4/2014 | Segall | E04H 1/1205 52/173.1 |
| 2020/0229328 | A1 * | 7/2020 | Deighton | E04C 2/46 |

* cited by examiner

Primary Examiner — James J Buckle, Jr.
(74) Attorney, Agent, or Firm — Capitol Patent + Trademark Law Firm, PLLC

(57) ABSTRACT

Electromagnetically shielded and self-supporting panels form a shielded enclosure. The use of prefabricated, shielded and self-supporting panels to construct an enclosure reduces the time and cost of constructing such an enclosure.

18 Claims, 10 Drawing Sheets

DETAIL "A"

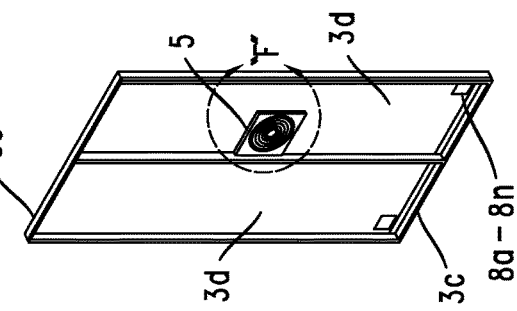
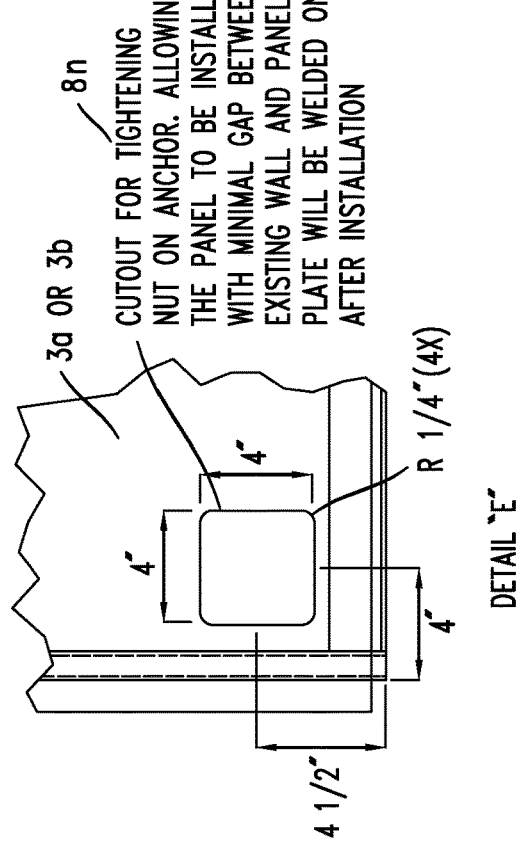
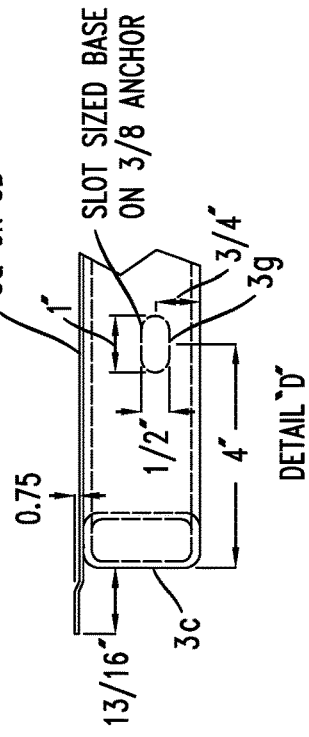
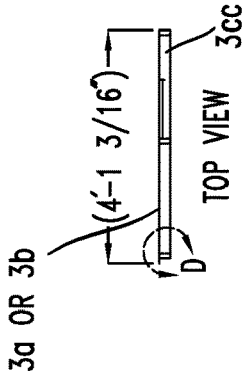
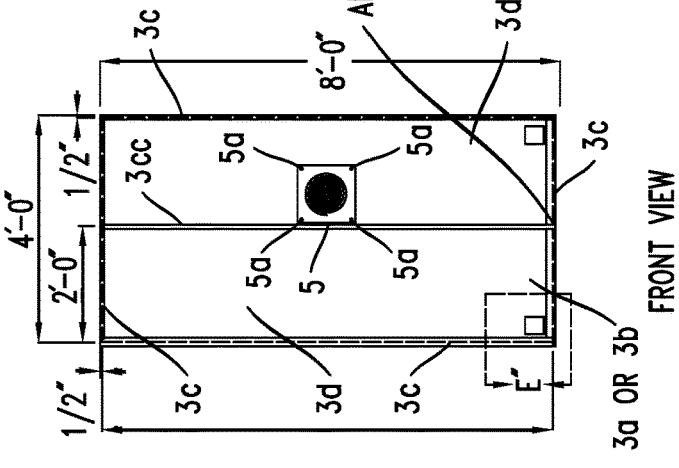

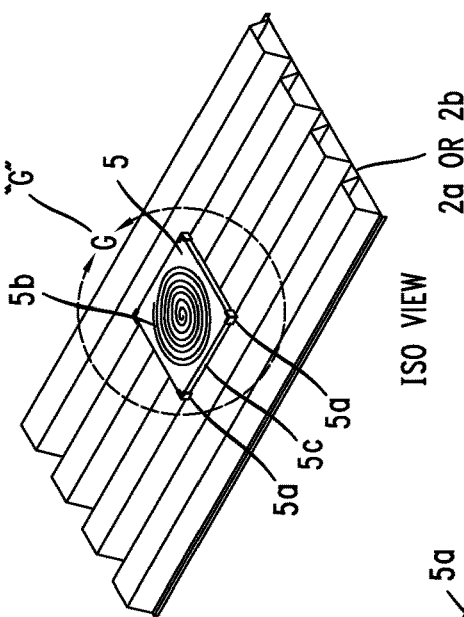
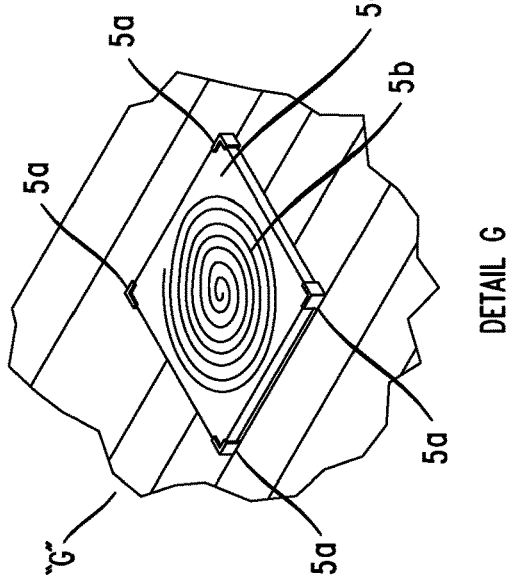
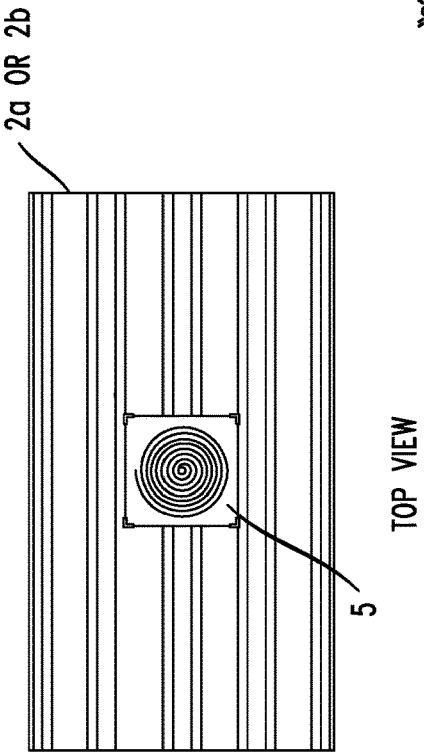
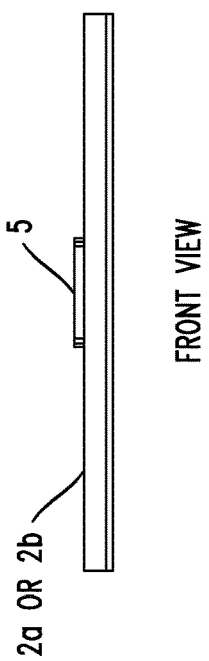

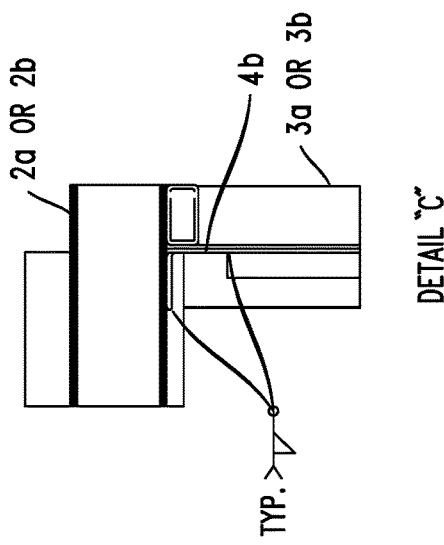
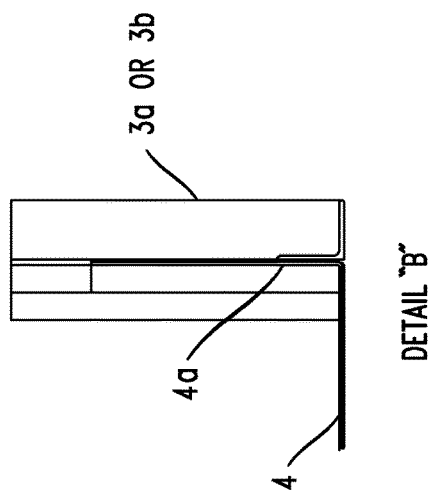
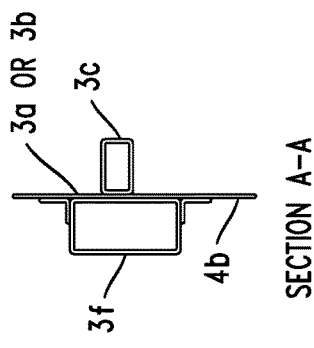
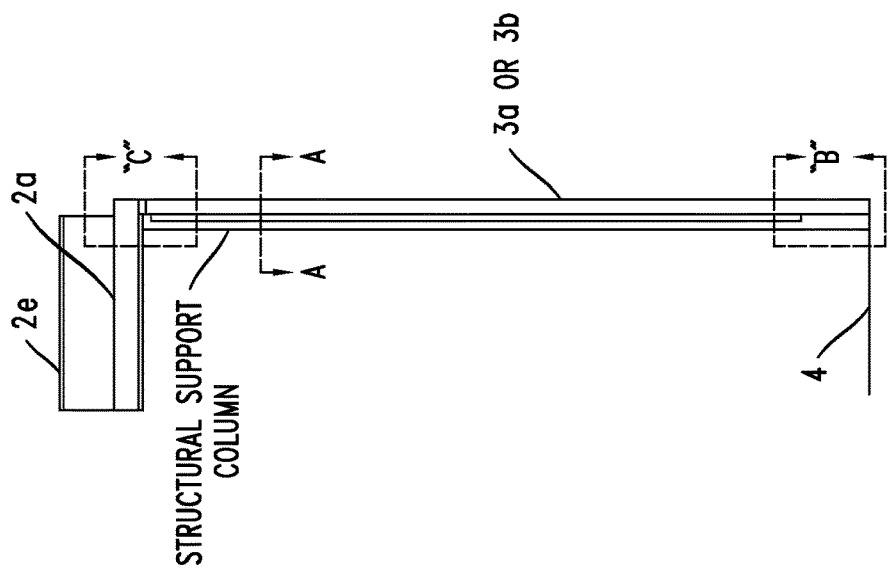

SHIELDED ENCLOSURES AND RELATED METHODS FOR PROTECTION FROM HIGH-ALTITUDE ELECTROMAGNETIC PULSES

GOVERNMENT LICENSE RIGHTS

This invention was made with U.S. government support under Contract Numbers FA8650-17-P-5036 and FA8650-18-C-5030 awarded by the Department of Defense. The U.S. government has certain rights in the invention.

TECHNICAL FIELD

This disclosure relates to the field of shielded enclosures for protecting against Electromagnetic Interference (EMI), such as High-Altitude Electromagnetic Pulses (HEMP).

Introduction

This section introduces aspects that may be helpful to facilitate a better understanding of the described invention(s). Accordingly, the statements in this section are to be read in this light and are not to be understood as admissions about what is, or what is not, in the prior art.

A man-made High-Altitude Magnetic Pulse (HEMP) is created through a nuclear explosion above the source region of the atmosphere (20 to 40 kilometers above the surface). High-energy gamma rays created by the explosion interact with air molecules in the source region to create an Electromagnetic Pulse (EMP). This pulse exposes conductors, electronic devices and electrical components to an electric field within line-of-sight of the explosion. The electric field intensity is dependent on several factors, with the type of device, altitude, and explosive magnitude being the primary factors, but can be on the order of 50 kV/m and 1000 s of amps. In particular, modern electronics are composed of solid-state devices that are very sensitive to EMP and require protective measures to ensure their survivability.

A HEMP event is divided into three periods or frequency bands (i.e., the HEMP spectrum): Early-time (E1), Intermediate-time (E2), and Late-time (E3). FIG. 1 shows a sample HEMP waveform with the three phases labeled where E1 is created immediately at detonation and is composed of high frequencies that affect short conductors, E2 is similar to lightning strikes and is protected using lightning protection and E3 is composed of low frequencies and impacts conductors that are greater than a kilometer, threatening power distribution and long communication lines.

The US Department of Defense (DoD) has issued standards (e.g., MIL-STD-188-125-1 and MIL-STD-461) that detail the protective measures that shall be implemented to protect critical DoD facilities from EMI and the entire HEMP spectrum.

Protection from a HEMP is most widely provided using a structure known as a Faraday Cage. This type of structure is a solid, continuous metal structure that protects everything within (i.e., a box). However, such a solid metal structure is not functional because there is no way to provide air, water, data signals, and other necessities for those who must work within such a structure.

Traditionally, the protection provided a facility was tailored to the structural design of the facility, its operational needs and the needs of those individuals working within the facility, for example. As the reader can imagine, this required significant one-time, non-recurring engineering (NRE) costs to design and fabricate a protective HEMP structure for each facility, which required significant time at the facility for construction and procurement of facility-specific materials, including the design and fabrication of custom (i.e., one-time use) shielded panels and other components which were limited to being used at one facility. Further, due to the one-time design of the structure, each facility required its own separate and distinct maintenance plan and replacement components (e.g., panels).

Accordingly, it is desirable to provide solutions that overcome the disadvantages of existing HEMP structures and methods of fabricating such structures.

SUMMARY

The inventors describe various exemplary, inventive EMI enclosures to protect against EMI, such as a HEMP event, for example, components of such enclosures and methods for constructing such inventive enclosures.

One such inventive enclosure may comprise an enclosure that may be shielded to protect against electromagnetic interference (EMI), where the enclosure may comprise: a plurality of pre-fabricated lightweight, self-supporting and shielded side panels and custom-made, lightweight self-supporting and shielded side panels conductively connected to form a contiguous side structure, wherein one or more of the side panels comprises tubing; a plurality of prefabricated, lightweight self-supporting and shielded top panels and custom-made, lightweight self-supporting and shielded top panels conductively connected to form a contiguous top structure, wherein each of the side panels and top panels are circumferentially welded to one another; and one or more bottom components. One or more of such side panels may be configured to support the load of one or more interior components, for example.

Such an exemplary enclosure may further comprise at least one shielded exterior door for entry into, and exit from, the enclosure from, or to, outside of the enclosure.

In an embodiment, the number of prefabricated side panels in an inventive enclosure may be greater than the number of custom-made side panels or the number of prefabricated top panels may be greater than the number of custom-made top panels, for example.

It should be understood that the inventive enclosures described herein may be configured as a stand-a-lone enclosure, or an enclosure retrofitted to an existing, non-shielded structure or a newly constructed enclosure.

One non-limiting weight (that can be carried by two men) of an inventive lightweight side panel may be 165 pounds or less.

In embodiments, inventive side panels may be composed of a mild steel, stainless steel, an aluminum, a copper or a conductive composite, for example.

Some embodiments of an inventive enclosure may comprise a system that controls an internal door and one or more external doors such that internal door (i) will not necessarily open at the same time as one of the external doors and (ii) will open at the same time as one of the external doors in case of an emergency.

One or more of the inventive side panels and top panels used as a part of an inventive enclosure may be composed of a copper alloy and may be conductively connected using a brazing process or, alternatively, may be composed of a conductive composite and conductively connected using conductive tape, for example.

Some inventive enclosures may comprise a HEMP vault, where such a vault may further comprise one or more openings configured to allow conduits to penetrate the enclosure to provide air, power, water, or communications into the enclosure and one or more Waveguide Below Cutoff filters, or another protective devices configured with each opening to prevent electromagnetic signals or fields from penetrating through such openings.

Additionally, one or more of the side and top panels of an inventive enclosure may comprise a corrosion protective coating. Alternatively, or in addition, one or more of the side panels may comprise an absorption layer to absorb or reduce transmission of audio signals from, or into, the enclosure and one or more of the top panels may comprise an absorption layer to absorb or reduce transmission of audio signals from, or into, the enclosure, An inventive enclosure may be coated with a fire-retardant layer. For example, when an existing enclosure is being retrofitted with an inventive enclosure and welding may be required.

The side panels of an inventive enclosure may comprise a first set of prefabricated side panels that have a first same size and a second set of prefabricated side panels that have a second same size, where the second size differs from the first size or wherein the plurality of top panels may comprise a first set of prefabricated top panels that have a first same size and a second set of prefabricated top panels that have a second same size, where the second size differs from the first size.

In embodiments, one or more inventive side panels may be rectangular in shape or curved and one or more inventive top panels may be rectangular in shape or curved.

Still further, one or more side panels of an inventive enclosure may be configured with an access opening to allow a floor joint brace to be connected to the side panel and to a bottom component and may be positioned such that there is a minimally-sized gap between the bottom component and a respective side panel, Such side panels may be further configured with a second opening to allow a side panel frame element to be connected to the bottom component.

In addition to the structure and components described above, an exemplary, inventive enclosure may also comprise one or more EMI antenna assemblies configured on an exterior and interior surface of one or more side panels or top panels. Each of the one or more EMI antenna assemblies that are configured on the exterior may comprise a transmitter and each of the one or more EMI antenna assemblies configured on the interior surface may comprise a receiver. Further, each of the antenna assemblies may still further comprise one or more non-conductive mounting components, each composed of a non-conductive material to hold a respective antenna assembly at a fixed position on the surface of a respective side or top panel and to electrically isolate the respective antenna assembly from the respective side or top panel.

Each of the one or more antenna assemblies (that comprise a transmitter) may be further configured such that such a transmitter is configured at a stand-off distance from another transmitter of another antenna assembly.

In an embodiment, the antenna assemblies may be connected to a real-time electronic monitoring, control and display subsystem, for example.

Regarding the top panels of an inventive enclosure, one or more of a plurality of top panels may comprise one or more layers, where one of the layers is an inner layer comprising an electromagnetic shielding material and another layer is an outer layer comprising a structural self-supporting material, for example. Such an outer layer may comprise a complex, corrugated-shaped surface to provide rigidity, for example.

The inventors also provide additional enclosures that do not include custom-made panels, one of which is an enclosure shielded to protect against EMI comprising: a plurality of pre-fabricated lightweight, self-supporting and shielded side panels conductively connected to form a contiguous side structure, wherein one or more of the side panels comprises tubing; a plurality of prefabricated, lightweight self-supporting and shielded top panels conductively connected to form a contiguous top structure, wherein each of the side panels and top panels are circumferentially welded to one another; and one or more bottom components. This type of enclosure may further comprise the additional features described above and elsewhere herein.

In addition to inventive enclosures, the inventors also provide for related methods for protecting an enclosure against EMI. One such method may comprise: constructing a plurality of pre-fabricated lightweight, self-supporting and shielded side panels and custom-made, lightweight self-supporting and shielded side panels; conductively connecting each of the side panels to form a contiguous side structure, wherein one or more of the side panels comprises tubing; constructing a plurality of prefabricated, lightweight self-supporting and shielded top panels and custom-made, lightweight self-supporting and shielded top panels; conductively connecting each of the top panels to form a contiguous top structure; circumferentially welding each of the side panels and top panels to one another; and constructing one or more bottom components, to name just a few of the features of an inventive method.

A further description of these and additional embodiments is provided by way of the figures, notes contained in the figures and in the claim language included below. The claim language included below is incorporated herein by reference in expanded form, that is, hierarchically from broadest to narrowest, with each possible combination indicated by the multiple dependent claim references described as a unique standalone embodiment.

BRIEF DESCRIPTION OF THE DRAWINGS

The present invention is illustrated by way of example and not limited in the accompanying figures in which like reference numerals indicate similar elements and in which:

FIGS. 3A and 3B depict an isometric view (FIG. 3A) and a front view (FIG. 3B) of an exemplary, inventive lightweight side panel according to an embodiment of the invention.

FIG. 3C depicts an enlarged view of a section of an exemplary inventive side panel according to an embodiment of the invention.

FIGS. 3D and 3E depict different views of an exemplary, inventive lightweight side panel according to an embodiment of the invention.

FIGS. 6A to 6D depict views of an exemplary HEMP antenna assembly connected to a top panel according to an embodiment of the invention.

FIGS. 7A to 7D depict exemplary connection points between top, side and bottom components (e.g., panels) of an inventive enclosure according to embodiments of the invention.

Figure 1:
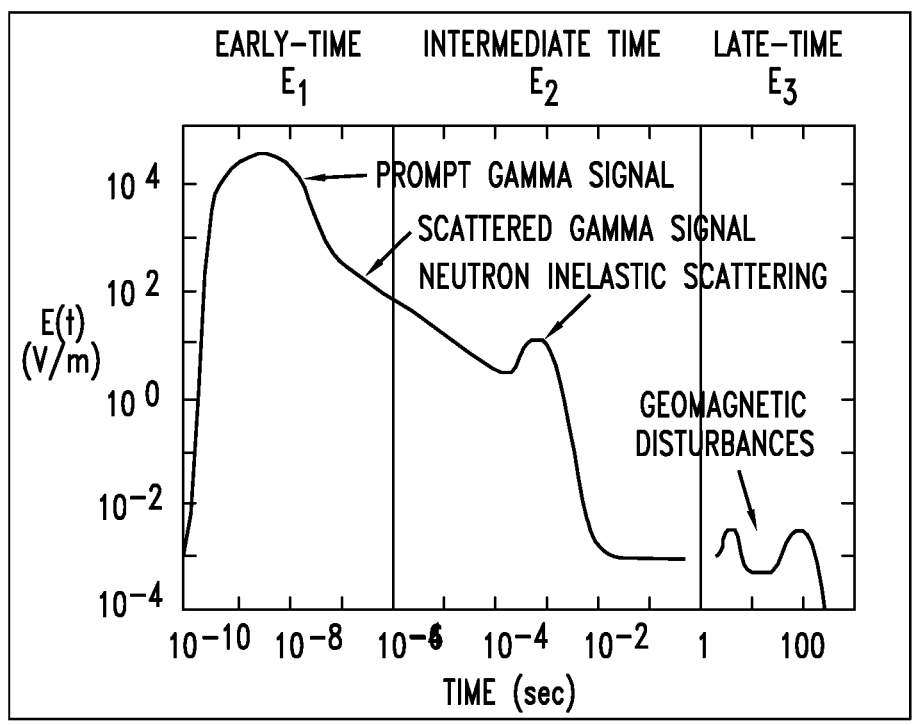
FIG. 1 shows a sample HEMP waveform.

Specific embodiments of the present invention are disclosed below with reference to various figures and sketches. Both the description and the illustrations have been drafted with the intent to enhance understanding. For example, the dimensions of some of the elements in the figures may be exaggerated or minimized (i.e., not to scale) relative to their actual size or relative to other elements, or well-known elements. Other elements and well-known elements that are beneficial or even necessary to a commercially successful implementation may not be depicted so that a less obstructed and a more clear presentation of embodiments may be achieved. Further, dimensions, weights and other parameters described herein are merely exemplary and non-limiting.

DETAILED DESCRIPTION

Simplicity and clarity in both illustration and description are sought to effectively enable a person of skill in the art to make, use, and best practice the present invention in view of what is already known in the art. One skilled in the art will appreciate that various modifications and changes may be made to the specific embodiments described herein without departing from the spirit and scope of the present invention. Thus, the specification and drawings are to be regarded as illustrative and exemplary rather than restrictive or all-encompassing, and all such modifications to the specific embodiments described herein are intended to be included within the scope of the present invention. Yet further, it should be understood that the detailed description that follows describes exemplary embodiments and is not intended to be limited to the expressly disclosed combination(s). Therefore, unless otherwise noted, features disclosed herein may be combined together to form additional combinations that were not otherwise described or shown for purposes of brevity.

As used herein and in the appended claims, the terms "comprises," "comprising," or any other variation thereof is intended to refer to a non-exclusive inclusion, such that a process, method, article of manufacture, device or apparatus (e.g., a connector) that comprises a list of elements does not include only those elements in the list, but may include other elements not expressly listed or inherent to such process, method, article of manufacture, device or apparatus. The terms "a" or "an", as used herein, are defined as one, or more than one. The term "plurality", as used herein, is defined as two, or more than two. The term "another", as used herein, is defined as at least a second or more. Unless otherwise indicated herein, the use of relational terms, if any, such as "first" and "second", "top", "bottom", and the like are used solely to distinguish one entity or action from another entity or action without necessarily requiring or implying any actual such relationship, priority, importance or order between such entities or actions.

The term "coupled", as used herein, means at least the energy of an electric field associated with an electrical current in one conductor is impressed upon another conductor that is not connected galvanically. Said another way, the word "coupling" is not limited to either a mechanical connection, a galvanic electrical connection, or a field-mediated electromagnetic interaction though it may include one or more such connections, unless its meaning is limited by the context of a particular description herein.

The use of "or" or "and/or" herein is defined to be inclusive (A, B or C means any one or any two or all three letters) and not exclusive (unless explicitly indicated to be exclusive); thus, the use of "and/or" in some instances is not to be interpreted to imply that the use of "or" somewhere else means that use of "or" is exclusive.

The terms "including" and/or "having", as used herein, are defined as comprising (i.e., open language).

The word "lightweight" as used herein means hand-carriable by two people.

As used herein the phrase electromagnetic interference or EMI includes, but is not limited to, a HEMP event.

It should also be noted that one or more exemplary embodiments may be described as a method. Although a method may be described in an exemplary sequence (i.e., sequential), it should be understood that such a method may also be performed in parallel, concurrently or simultaneously. In addition, the order of each formative step within a method may be re-arranged. A described method may be terminated when completed, and may also include additional steps that are not described herein if, for example, such steps are known by those skilled in the art.

As used herein, "rectangular" denotes a geometry which includes a "square" geometry as an exemplary subset of rectangular geometry.

As used herein the phrase "shielded" means a component, structure, enclosure or method that uses such physical devices configured to prevent electromagnetic signals and fields, such as those generated from a HEMP, from penetrating the particular component, structure or enclosure unless the context or knowledge of one skilled in art indicates otherwise.

As used herein the phrase "self-supporting" structure means a structure that can support its own weight and an additional load that weighs no more than half the weight of the structure without requiring external support structures, such as a vertical or horizontal beam.

As used herein, the term "embodiment" or "exemplary" mean an example that falls within the scope of the invention(s).

As described herein, the inventors discovered inventive EMI enclosures and related methods for constructing and/or fabricating EMI enclosures and components that (i) provide protection from HEMP events, (ii) are ruggedized, (iii) can be used to meet specific, custom designs required by a facility at (iv) significantly reduced fabrication, installation, and design costs.

As explained further herein, the inventors believe that the inventive methods and resulting inventive enclosures and components require significantly less time on a facility's site (i.e., onsite) as compared to existing methods because, for example, inventive self-supporting components (e.g., panels) may be prefabricated and, therefore, greatly simplify the erection of an inventive HEMP enclosure onsite (e.g., only welding to other panels may be required onsite).

Inventive, self-supporting panels discovered by the present inventors are lightweight (i.e., two-person portable).

Further, the inventive enclosures and their components may be used as single-room or multi-room enclosures (e.g., a complete facility, building), for constructing new enclosures or for retrofitting existing facilities.

Figure 2A:
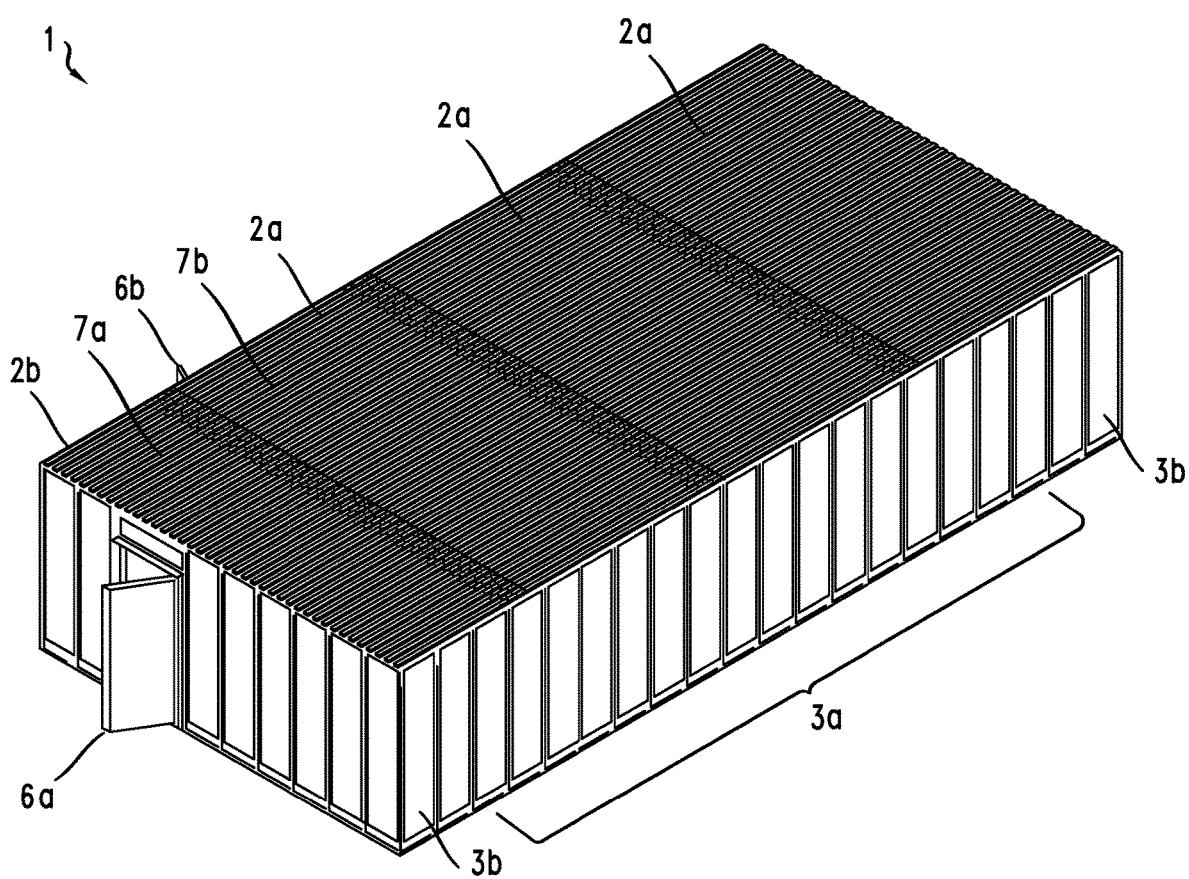
FIGS. 2A and 2B depict different views of an exemplary, inventive HEMP enclosure according to embodiments of the invention.

Referring now to FIG. 2A there is depicted a simplified view of an exemplary, inventive enclosure 1 according to an embodiment of the invention. As will be explained in more detailed herein, in one embodiment the enclosure 1 may be constructed of, and comprise, a plurality of pre-fabricated inventive, lightweight, self-supporting and shielded side panels 3a and custom made, inventive, lightweight self-supporting and shielded panels 3b forming an exterior boundary or wall(s), a plurality of prefabricated, inventive self-supporting and shielded top panels 2a and custom-made, inventive self-supporting and shielded top panels 2b and one or more bottom components (not shown in FIG. 2A, but see components 4 and 4a in FIGS. 7A and 7D, for example). Also shown is at least one shielded exterior door 6a for entry into, and exit from, the enclosure 1 from/to outside of the enclosure 1 that provides at least the same level of shielding as the inventive panels 3a, 3b.

It should be understood that a "prefabricated" panel is a panel that has dimensions that can be repeatedly used to make a plurality of panels while a "custom-made" panel is typically a panel that has unique, perhaps one-of-a-kind dimensions, that are typically limited to one or a limited number of panels. In the inventive enclosures discussed herein the number of prefabricated (side or top) panels included in an inventive enclosure is preferably greater than the number of (side or top) custom-made panels included in such an enclosure.

While FIG. 2A depicts an example of a constructed stand-a-lone, inventive enclosure 1 it should be understood that an inventive enclosure and inventive panels may be retrofitted to an existing, non-shielded structure. In such an embodiment, the inventive panels 2a, 2b, 3a, 3b may be fastened to part of an existing structure using studs or bolts, for example. Though not shown in FIG. 2A, the shielded enclosure 1 may also include one or more shock isolators to absorb any unwanted vibrations due a seismic event, for example.

In embodiments, each of the lightweight side panels 3a, 3b may be composed of a mild steel to name just one non-limiting composition. In an embodiment, a non-limiting exemplary weight of an exemplary, inventive lightweight side panel that can be carried by two people may be 165 pounds or less. Alternatively, the side panels 3a, 3b may be composed of a stainless steel, an aluminum, a copper or a conductive composite, for example.

Figure 2B:
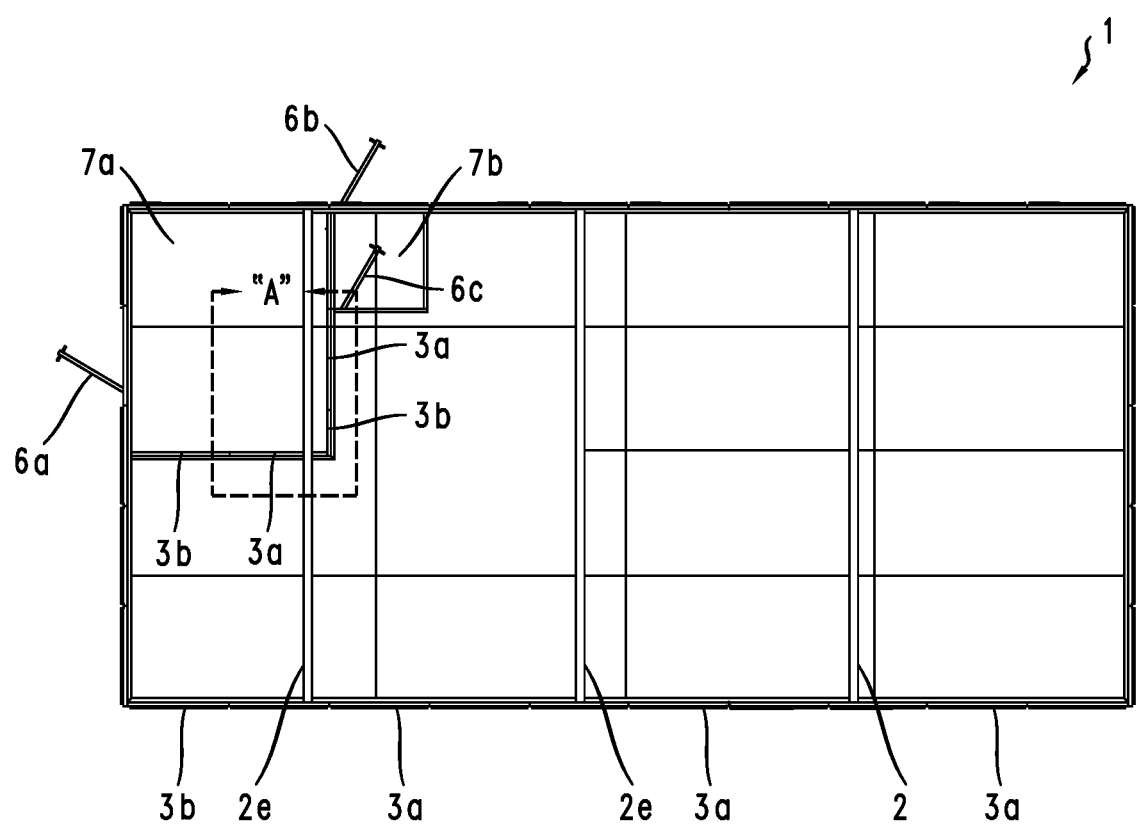

FIG. 2B depicts a different view of the constructed enclosure 1 (i.e., a top view) where the top panels 2a, 2b have been removed (not shown) to allow the reader to "see" inside the enclosure 1. In this embodiment, the enclosure 1 has two shielded, exterior doors 6a, 6b each configured to be connected to the enclosure 1 and provide at least the same level of shielding as the panels 3a, 3b. In embodiments, the doors allow entrance into, and exit from, a respective, interior structure 7a, 7b (e.g., a room, vestibule) of the enclosure 1. In one embodiment, each of the interior structures 7a, 7b may also be constructed using one or more inventive panels 2a, 2b, 3a, 3b and may be connected to other areas of the enclosure 1 using an internal door 6c, for example. In embodiments, each door or opening may be dimensionally configured to allow equipment and personnel that require entrance into the enclosure 1 to pass through. Further, the enclosure 1 may include a mechanical, electrical or electro-mechanical system (not shown) that controls the internal door 6c and one or both (or, if there are more than two, some subset of the doors or all of the doors) of the external doors 6a, 6b such that internal door 6c will not necessarily open at the same time as one of the external doors 6a, 6b, and, instead may require additional security measures to open the internal door 6c. In an embodiment, the control system may be configured to allow the external doors 6a, 6b to open at the same time as the internal door 6c in case of an emergency.

In embodiments, each of the side panels 3a, 3b may be conductively connected together to form a contiguous, shielded side structure (e.g., a wall, boundary, having no gaps to prevent electromagnetic signals or fields from penetrating), each of the top panels 2a, 2b may be conductively connected together to form a contiguous, shielded top structure (e.g., a roof).

In more detail, each of the side panels 3a, 3b and top panels 2a, 2b respectively, may be circumferential welded to one another (e.g., side panel to side panel, top panel to top panel, side panel to top panel, and floor to side panel) to form contiguous, shielded side structures, top structures, and enclosures, such as enclosure 1, respectively, for example. Such a weld will be without any structural or electromagnetic defects and be non-porous.

Alternatively, if one or more of the panels 2a, 2b, 3a, 3b is composed of a copper alloy such panels may be conductively connected using a brazing process. Still further, if one or more of the panels 2a, 2b, 3a, 3b is composed of a conductive composite such panels may be conductively connected using conductive tape, for example.

In an embodiment, when an existing facility (e.g., room or building) is retrofitted with inventive side and top panels then one or more protective coatings (e.g., a corrosion protective coating) may be applied to the existing structure of the existing facility and/or to one or more of the inventive panels (unless the panels already comprise such a coating) to provide long term protection from corrosion, for example, that could adversely affect the level of shielding. In addition, during installation of the inventive panels to an existing structure using a high-temperature welding process, for example, such a structure may be coated or pre-coated with a fire-retardant layer to provide protection during installation of a welded, shielded panel over the existing structure. Similarly, during construction of a new, inventive enclosure the enclosure may be coated with a corrosion protection coating, for example, to increase the life of the shield and minimize maintenance costs.

FIG. 2B also indicates a section of the inventive enclosure 1 labeled "detail A". An enlarged view of detail A is shown in FIG. 2C.

Figure 2C:
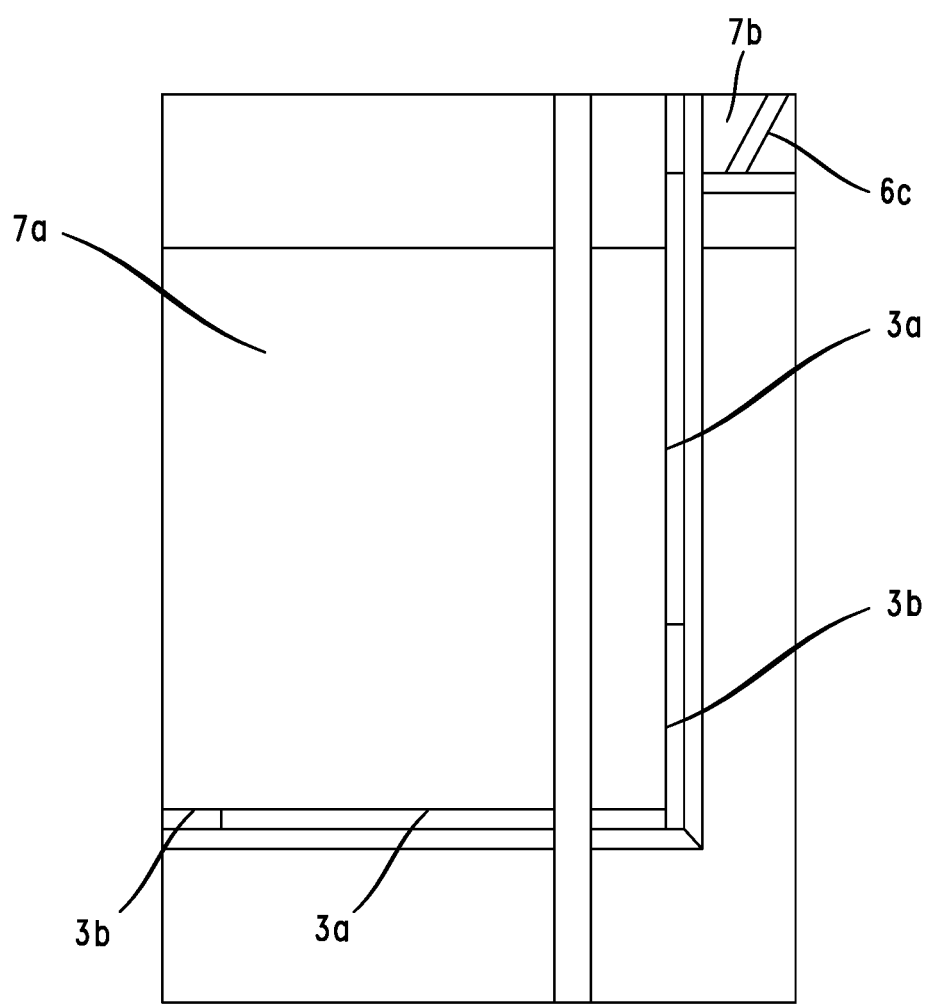
FIG. 2C illustrates an interior view of a section of an exemplary, inventive HEMP enclosure according to embodiments of the invention.

In FIG. 2C there is depicted two different dimensionally-sized, side panels 3a, 3b that are a part of inventive enclosure 1, where lightweight side panel 3a may comprise a self-supporting, prefabricated panel while panel 3b may comprise a self-supporting, custom made panel, for example. In an embodiment, a custom-made panel 3b may be preferably positioned as a corner panel to complete the linear run and form a wall, for example.

In an embodiment, the inventors believe that prefabricating inventive side-panels, such as panel 3a, leads to a substantial reduction in the need to fabricate a large number of panels on site (i.e., at the location of a facility to be constructed, or at the location of an existing facility to be retrofitted). The inventors believe that the ability to construct or retrofit a large number sides or walls using prefabricated side-panels substantially reduces the time (and cost) it takes to retrofit or construct a particular shielded side or wall as well as the entire enclosure because fewer custom-made side-panels are required.

For example, in FIG. 2C, to construct section "A" of the enclosure 1, two inventive, lightweight prefabricated side-panels of the same dimensions 3a (i.e., the same size) are used and only one custom made side-panel 3b is used. FIG. 2A illustrates another example where an entire side or wall of the enclosure 1 may comprise a plurality of prefabricated, lightweight side-panels of the same dimensions 3a and only two custom made side-panels 3b.

In addition, an inventive enclosure may include a so-called "HEMP closet" or "HEMP vault" (hereafter collectively "HEMP vault") along an external wall of side panels, for example, and may be configured with one or more openings configured to allow conduits to penetrate the enclosure to provide the necessary air, power, water, and/or communications (e.g., fiber optic) into the enclosure 1. In an embodiment, an exemplary HEMP vault may be configured to enclose or include all of such penetrations if possible in order to simplify any required EMI testing and repairs, if necessary. Accordingly, to prevent electromagnetic signals or fields from penetrating through such openings, each opening may be configured to include one or more Waveguide Below Cutoff (WBC), filters, or other protective devices.

While the custom-made side panels 3b in FIG. 2A are positioned as corner panels of a constructed wall or side and all of the prefabricated panels 3a are positioned as middle panels of a constructed wall or side (i.e., in between two corners) this is merely exemplary. In other embodiments, a prefabricated side-panel 3a may be positioned as a corner panel and a custom-made panel 3b may be positioned as a middle panel.

In another embodiment, no custom-made side panel 3b may be required to construct or retrofit a side or wall of an inventive enclosure provided the total length of the wall can be constructed using just prefabricated side panels, where each side panel may have as the same prefabricated dimensions (i.e., same size).

Still further, in another alternative embodiment, no custom-made side panel 3b may be required to construct or retrofit a side or wall of an inventive enclosure provided the total length of the wall can be constructed using two or more differently-sized, prefabricated side panels. For example, one embodiment may utilize a first set of prefabricated side panels that have a first same size (i.e., same width and height, e.g., 8 feet by 4 feet)) and a second set of prefabricated side panels that have a second same size (e.g., 9 feet by 4 feet), where the second size differs from the first size.

In sum, one example of an inventive, shielded side or wall of an inventive shielded enclosure includes at least one or more inventive, prefabricated lightweight, self-supporting and shielded side panels and may include one (or more) inventive, custom-made lightweight, self-supporting and shield side-panels, for example.

Similarly, the inventors discovered inventive top panels for constructing or forming the top or ceiling of an inventive enclosure.

In FIG. 2A there is depicted two different dimensionally-sized, top panels 2a, 2b that are a part of inventive enclosure 1, where panel 2a comprises an inventive, prefabricated, self-supporting and shielded top panel while panel 2b may comprise an inventive, custom made, self-supporting and shielded top panel, for example. In an embodiment, the inventors believe that prefabricating top-panels, such as panel 2a, leads to a substantial reduction in the need to fabricate a large number of custom top-panels on site. The ability to construct or retrofit a large number tops or roofs using prefabricated top-panels substantially reduces the time (and cost) it takes to retrofit or construct a particular shielded top or roof as well as the entire enclosure because fewer custom-made top-panels are required to be constructed on site.

For example, in FIG. 2A, to construct the inventive enclosure 1, the enclosure 1 utilizes three inventive, prefabricated top-panels of the same dimensions 2a (i.e., the same size) and only one custom made 2b whose dimensions limit its use for a particular, single enclosure or a limited number of similar sized enclosures.

Similar to above, while the custom-made top panel 2b in FIG. 2A is positioned as a top, corner panel of a top or roof this is merely exemplary. In other embodiments, a prefabricated side-panel may be positioned as both top corners and a custom-made top panel may be positioned in the middle of the top or roof.

In sum, an inventive shielded top or roof of an inventive, shielded enclosure may include at least one or more prefabricated shielded top panels and one (or more) custom-made shielded top-panels, for example.

In another embodiment, no custom-made top panel 2b may be required to construct or retrofit a top or roof of an inventive enclosure provided the total length of the top can be constructed using just prefabricated top panels (e.g., one prefabricated sized top panel, or more than one sized of prefabricated top panels).

For example, one embodiment may utilize a first set of inventive, prefabricated top panels that have a first same size (e.g., same width and height) and a second set of inventive, prefabricated top panels that have a second same size (e.g., same width and height), where the second size differs from the first size.

Referring now to FIGS. 3A and 3B there is depicted an isometric view (FIG. 3A) and a front view (FIG. 3B) of an exemplary, inventive lightweight HEMP shielded side panel 3a according to an embodiment of the invention. FIG. 3B illustrates exemplary, non-limiting dimensions of an inventive side panel 3a, though these dimension are merely exemplary. Further, while the inventive side panels 3a (as well as inventive top panels 2a) are shown as being rectangular in shape in the figures, it should be understood that this is merely exemplary. For example, one or more self-supporting, curved side or top panels having one or more of non-linear edges may also be used to form an inventive enclosure.

In the embodiments depicted in FIGS. 3A and 3B each of the exemplary lightweight side panel 3a comprises a substantially flat shielded panel insert 3d and may comprise one or more connected, shielded side panel frame elements 3c (e.g., square tubing), where elements 3c may be configured to be connected around edges of a substantially flat shielded panel insert 3d and, additionally, may optionally be configured across a vertical or horizontal section of an insert 3d to support insert 3d, for example (see self-supporting frame 3cc in FIG. 3B). In embodiments the insert 3d and frames 3c, 3cc may compose a type of mild steel, for example. Alternatively, the insert 3d and frames 3c, 3cc may be composed of a stainless steel, an aluminum, a copper or a conductive composite, for example.

In embodiment, the frames 3c, 3cc may be connected to the insert 3d by welding when the insert and frame(s) is composed of a steel for example. Alternatively, if an insert 3d and frame 3c, 3cc are composed of a copper alloy then each may be connected together using a brazing process. Still further, if an insert 3d and frame 3c, 3cc are composed of a composed of a conductive composite then each may be connected together using conductive tape, for example.

In embodiments, the inclusion of frames 3c, 3cc in a panel 3a make it unnecessary to use external support structures such as a beam, for example, to support an individual panel 3a.

Each self-supporting lightweight side panel 3a may be carried by two people (i.e., two-person portable), for example.

In an embodiment, as depicted in FIG. 3B at a position 3e of an exemplary panel 3a frames 3c, 3cc may be configured to intersect. In more detail, a panel 3a may comprise a vertical frame element 3cc that is configured with an angular notch or passageway to allow a horizontal frame element 3c to pass through, for example (or vice-versa).

In embodiments, the inserts 3d of one or more side panels 3a or 3b may be configured to overlap frames 3c (e.g., square tubing) of an adjacent panel 3a or 3b, allowing the inserts 3d (i.e., the flat surfaces of each panel) of such panels to be constructed or connected together using continuous welds, for example, (when the panels are composed of a steel), and minimizing the risk of hot sparks from welds igniting an existing structure or nearby structures.

Further, while FIGS. 3A and 3B depict a self-supporting frame 3cc across a vertical section of an insert 3d, this is merely exemplary. Alternatively, some inventive lightweight panels 3a do not include such a self-supporting frame across a vertical (or horizontal) section. For example, depending on the particular design of the panel 3a, one or more of the panels 3a that have a width (measured along the x-axis) of 10 to 15 feet may not require such an intermediate, self-supporting structure as frame 3cc.

Referring now to FIG. 3C there is illustrated an enlarged view of a section of an exemplary inventive side panel 3a according to an embodiment of the invention. As shown, as a part of the construction of the enclosure one or more of the side panels 3a may be configured with an access opening 8a to allow a floor joint brace (e.g., an angle iron, see component 4a in FIG. 7B) to be connected to a side panel 3a and to the floor 4 (e.g., to a floor of an existing facility being retrofitted) or a bottom component using a combination of a nut and bolt, for example, in order to connect the side panel to the floor. Further, the access opening may be positioned such that there is a minimally-sized gap between the existing floor (or wall) and an inventive panel.

While access opening 8a in FIG. 3C is depicted as being positioned in a lower corner of a side panel 3a, 3b this is merely exemplary. In alternative embodiments, an access opening may be positioned in a different section of a side panel. For example, an opening may be positioned at the top of a side panel in order to connect a side panel to the top or roof of an existing structure, for example. In general, an opening may be positioned in a panel to connect a panel to another component of an existing structure or enclosure during retrofitting of such a structure or enclosure, for example.

Similar openings may be included in custom made panels 3b to connect one side panel 3b to another component of an existing structure or enclosure using an angle iron, for example (see element 4a in FIG. 7B).

Still further, the inventive, self-supporting panels 3a (as well as custom-made panels 3b) may be constructed or configured to support the load of one or more light fixtures, sheet rock, internal furnishings, etc., (collectively "interior components") for example. In embodiments, one or more fasteners (not shown in figures) for attaching these interior components to a panel 3a or 3b may be provided. Such fasteners may be connected to a panel 3a, 3b using welds or an epoxy, for example. In embodiments, if an enclosure 1 includes such interior components, such components are installed before testing of the enclosure is completed so that the electromagnetic shielding integrity of the shielded panels 3a, 3b of upon which the interior component is connected is not compromised. After testing, a non-conducting epoxy may be added to additional connection points of an interior component.

In embodiments, an inventive, self-supporting side panel 3a or top panel 2a may be configured to comprise one or more additional layers to shield the occupants or equipment within the enclosure 1 from other signals other than EMI signals. For example, an inventive side panel or top panel may include an absorption layer to absorb or reduce the transmission of signals having an audio frequency (i.e., audio signals) from, or into, an inventive enclosure.

FIGS. 3A and 3B also include a depiction of an optional EMI antenna assembly 5. In an embodiment, an enclosure 1 may be constructed to include one or more EMI antenna assemblies 5, where one (or more) assembly 5 may be configured on (i.e., mounted on or within) an exterior and interior surface of a panel 3a, 3b.

In an embodiment, an assembly 5 mounted on the exterior surface of a panel 3a, 3b may comprise a transmitter (not shown in figures). Further, a second assembly 5 mounted on the interior surface of the panel 3a, 3b may comprise a receiver, for example (not shown in figures).

So configured, the set of antenna assemblies may be operable to complete a self-test of the panel 3a, 3b. For example, one or more electromagnetic frequencies may be transmitted from the assembly 5 that is on the exterior of a panel 3a, 3b. At the same time, the assembly 5 on the interior of the panel 3a, 3b may be operable to detect those electromagnetic frequencies that may penetrate the panel 3a, 3b where the assembly 5 is configured (i.e., positioned). In this way the EMI shielding effectiveness of a panel can be tested (i.e., if no EMI frequencies are detected the shielding of the panel is effective, and does not need to be replaced or repaired).

Still further, each antenna assembly 5 may be connected to a real-time electronic monitoring, control and display subsystem (not shown) to indicate one or more detected frequencies (or no detected frequencies) so that a user of the enclosure 1 or maintenance personnel is informed of the electromagnetic shielding status of a panel 3a, 3b (e.g., so that a panel 3a, 3b upon which an assembly 5 is configured, may or may not need to be repaired or replaced).

While more than one assembly 5 may be mounted on an exterior or interior surface of a single panel 3a, 3b in embodiments, each transmitting antenna assembly 5 may be configured at a distance (separation) from one another to avoid detection of a repetitive signal, for example (sometimes referred to as a "stand-off" distance). In an embodiment, each assembly may be separated by a maximum distance of 10 feet, for example, to name a non-limiting distance. In alternative embodiments, the stand-off distance is less than 10 feet. Still further, the stand-off distance may vary depending on the transmission and/or reception capabilities of a given assembly 5.

Referring to FIGS. 3D and 3E there are depicted additional views of an inventive panel 3a (or custom panel 3b). As shown, a second opening 3g is positioned through a bottom frame 3c of a panel 3a, 3b. In embodiments, as a part of the construction of the enclosure a second nut and bolt may be passed through the opening 3g to connect a side panel frame element 3c to a bottom component (e.g., foundation, floor of an existing structure). To access the opening 3g a user (e.g. installer of the panel 3a, 3b) may first access the opening 8n in the same panel 3a, 3b shown in FIG. 3C.

Figure 4A:
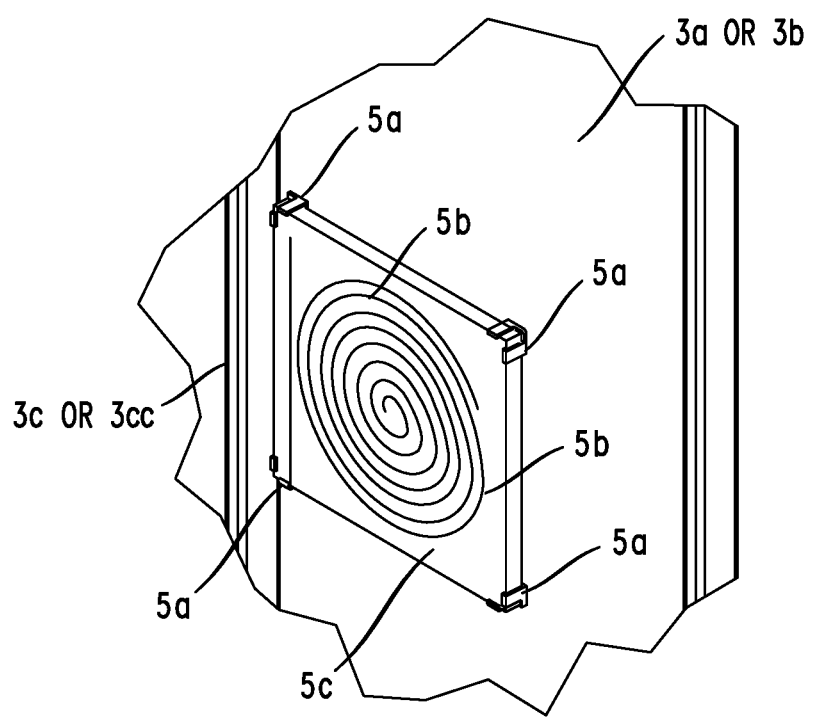
FIG. 4A depicts an enlarged view of an exemplary HEMP antenna assembly connected to a side panel according to an embodiment of the invention.

Referring now to FIG. 4A there is depicted an enlarged view of an exemplary antenna assembly 5 according to an embodiment of the invention. In an embodiment, an inventive assembly 5 may comprise an electromagnetic antenna 5b configured to be physically connected to an antenna body 5c and mounting components 5a. In FIG. 4A the assembly 5 comprises a transmitter (not shown) and transmission antenna 5b mounted on an exterior surface of a panel 3a, 3b, though it should be understood that an assembly 5 may comprise a receiver and receiving antenna mounted on an interior surface or a transceiver and a transceiving antenna that may be mounted on an exterior or interior surface of a panel 3a, 3b.

As depicted, the exemplary assembly 5 may comprise one or more integral non-conductive mounting components 5a (e.g., studs), each of which may be composed of a non-conductive, thermo-plastic material and may be mounted to a surface of the panel 3a, 3b using an adhesive or epoxy, for example, to hold the assembly 5 at a fixed, stand-off position corresponding to a stand-off distance on the surface of the panel 3a, 3b for example, and to electrically isolate the antenna 5b from the panel 3a, 3b. Alternatively, one or more of the components 5a may not be integral to the body 5c. In an embodiment components 5a may first be connected to a frame 3c, 3cc of a panel 3a, 3b using an adhesive or epoxy, for example, and then the assembly 5 may be forcibly inserted into (e.g., snapped into) the space between each component 5a. The resisting force(s) of the components 5a are operable to hold the assembly 5 in place.

Figure 4B:
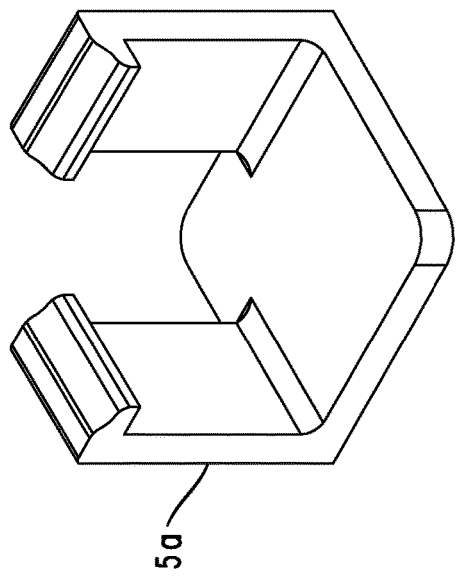
FIGS. 4B to 4D depict enlarged views of a mounting component for an inventive HEMP antenna assembly according to embodiments of the invention.
Figure 4C:
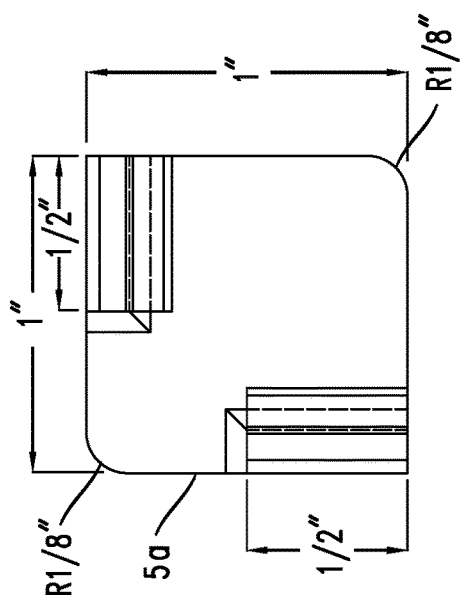
Figure 4D:
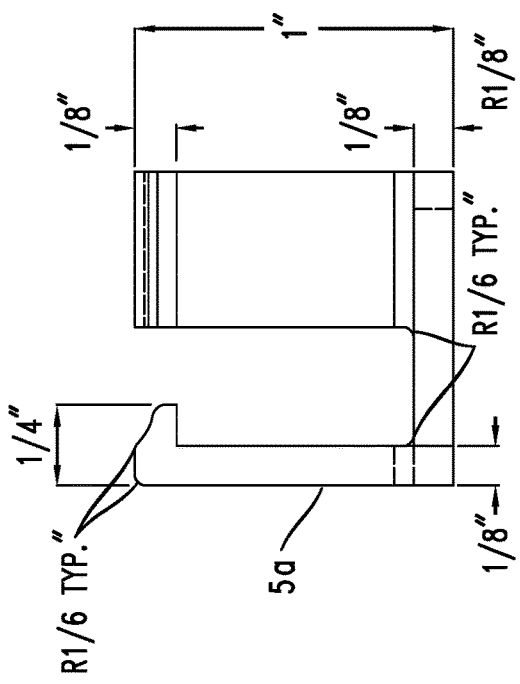

Referring now to FIGS. 4B to 4D there are depicted enlarged views of a mounting component 5a that may function to mount an antenna assembly 5 to a side panel 3a, 3b or, as explained further herein, to a top panel 2a, 2b. Though FIGS. 4C and 4D depict dimensions it should be understood that such dimensions are non-limiting, and merely exemplary. In embodiments, the dimensions of the component 5a may vary as the thickness of a panel or size of an assembly 5 varies. As discussed previously, to attach an inventive antenna assembly 5 to a side or top panel the components 5a may be first connected to a panel, and, thereafter an assembly 5 may be inserted into one or more components 5a to fixably connect the assembly 5 to a panel. Alternatively, if the component 5a are integral with the assembly 5 or already connected to the assembly 5, then the assembly 5 and component 5a may be connected as one component to a panel.

Figure 5:
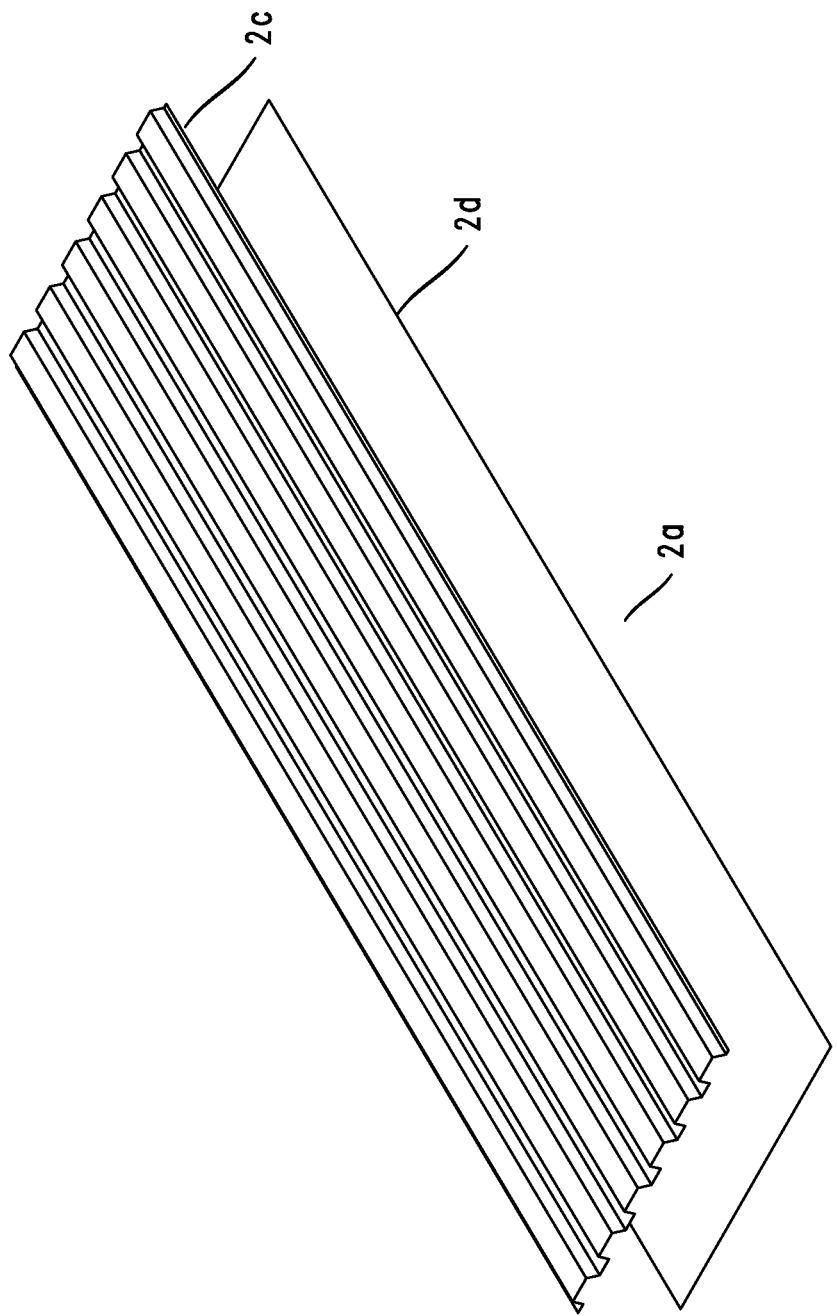
FIG. 5 depicts a view of a single, exemplary inventive HEMP shielded, top panel according to embodiments of the invention.

Referring now to FIG. 5 there is depicted a view of a single, exemplary inventive lightweight shielded, prefabricated top panel 2a (i.e., each panel 2a or 2b is two-man portable). As shown, each panel 2a (or custom-made panel 2b) may comprise one or more layers 2c, 2d. Though only two layers are depicted in FIG. 5 it should be understood that alternative top panels may comprise additional layers or conversely, the layers may be combined into a single layer. In an embodiment a first or inner layer 2d may comprise an electromagnetic shielding material, such as a flat steel to name just one of a number of materials that may be used, while a second or outer layer 2c may comprise a structural self-supporting material, such as a corrugated-shaped metal to name just one of a number of materials that may be used, to provide structural strength to the top panel 2a. In an embodiment, layer 2c may be configured as a complex, shaped surface (e.g., corrugated) to provide rigidity to each panel 2a (or 2b). Such rigidity makes each prefabricated panel 2a (or 2b) self-supporting. Further, layer 2d may be formed as a substantially flat layer to allow such a layer to be connected to another adjacent layer of a top panel, for example. In an embodiment, when the layers 2c, 2d comprise a steel, the layers may be welded together, for example.

Yet further, in embodiments when the material selected as the composition for the inner layer 2d comprises a steel, prefabricated top panels 2a may be welded together (and to side panels, as described elsewhere herein) without needing to form top panels that include complex geometries or angles, to name one conductive connection method.

Alternatively, if one or more of the panels 2a (or 2b) is composed of a copper alloy such panels may be conductively connected using a brazing process. Still further, if one or more of the panels 2a, 2b is composed of a conductive composite such panels may be conductively connected using conductive tape, for example.

In embodiments inventive layer 2c may be 4.5 inches thick, 24 inches wide, and up to 15 feet in length, for example, while inventive layer 2d may have a thickness of 16 to 20 gauge, though it should be understood that these dimensions are non-limiting and merely exemplary Further, each of the inventive panels 2a, 2b may be designed to allow maximum span without requiring internal support columns that reduce the useful area inside the protected volume of the enclosure 1.

When additional support for prefabricated, self-supporting panels 2a (as well as custom-made panels 2b) is required, the enclosure 1 may constructed of, or include, one or more support beams 2e (see FIG. 2B). In embodiments, beams may be required for long roof spans, additional roof loads, or when additional rigidity may be required, and can be installed inside or outside the shielded volume of the enclosure 1. Beams may also be attached to frames 3c side panels 3a, 3b, for example.

Still further, prefabricated panels 2a (as well as custom-made panels 2b) may be constructed or configured to support the load of one or more light fixtures, interior ceiling panels, etc. that may be attached to the interior layer 2d (or a similar interior layer of a custom-made panel), for example. In embodiments, one or more fasteners (not shown in figures) for attaching these interior components to the interior layer 2d may be provided. Such fasteners may comprise a non-conductive material and may be connected to layer 2d using welds or an epoxy, for example. In embodiments, if an enclosure 1 includes such interior components, such components are installed before testing of the enclosure is completed so that electromagnetic shielding integrity of the shield layer 2d of upon which the interior component is connected is not compromised. After testing, a non-conducting epoxy may be added to additional connection points of an interior component.

It should be understood that the description above for the prefabricated top panels 2a may be applicable to each of the custom-made top panels 2b as well.

FIGS. 6A to 6D depict different views of an exemplary antenna assembly 5 connected to a prefabricated top panel 2a (or custom-made panel 2b) according to an embodiment of the invention. Similar to antenna assemblies 5 that are connected to a side panel, in embodiments of the invention an enclosure 1 may include one or more antenna assemblies 5. In an embodiment, an assembly 5 may comprise a transmitter (not shown) and transmitting antenna 5b and may be mounted on an exterior surface of a panel 2a, 2b. Further, a second assembly comprising a receiver and receiving antenna may be mounted on an interior surface of the same panel 2a, 2b, for example (not shown in figures) or at another position within the enclosure 1.

So configured, the set of antenna assemblies may be operable to complete a self-test of the panel 2a, 2b. For example, one or more electromagnetic frequencies may be transmitted from the assembly 5 that is on the exterior of a panel 2a, 2b. At the same time, the assembly 5 on the interior of the panel 2a, 2b may be operable to detect those electromagnetic frequencies that may penetrate the panel 2a, 2b where the assembly 5 is configured (i.e., positioned). In this way the EMI shielding effectiveness of a panel can be tested (i.e., if no EMI frequencies are detected the shielding of the panel is effective, and does not need to be replaced or repaired).

Still further, each antenna assembly 5 may be connected to a real-time electronic monitoring, control and display subsystem (not shown) to indicate one or more detected frequencies (or no detected frequencies) so that a user of the enclosure 1 or maintenance personnel is informed of the electromagnetic shielding status of a panel 2a, 2b (e.g., so that a panel 2a, 2b upon which an assembly 5 is configured, may or may not need to be repaired or replaced).

While more than one assembly 5 may be mounted on an exterior or interior surface of a single panel 2a, 2b in embodiments, each antenna assembly 5 may be configured at a distance (separation) from one another to avoid detection of a repetitive signal, for example (sometimes referred to as a "stand-off" distance). In an embodiment, each assembly may be separated by a maximum distance of 10 feet, for example, to name a non-limiting distance. In alternative embodiments, the stand-off distance is less than 10 feet. Still further, the stand-off distance may vary depending on the transmission and/or reception capabilities of a given assembly 5.

FIG. 6B depicts an enlarged view of an exemplary antenna assembly 5 according to an embodiment of the invention. In this embodiment an inventive assembly 5 may comprise an electromagnetic antenna 5b configured to be physically connected to an antenna body 5c. As depicted, the assembly 5 may comprise one or more integral, non-conductive mounting components 5a (e.g., studs), each of which may be composed of a non-conductive, thermo-plastic material and may be connected to a surface of the panel 2a, 2b using an adhesive or epoxy, for example, to hold the assembly 5 at a fixed, stand-off position corresponding to a stand-off distance on the surface of the panel 2a, 2b for example, and to electrically isolate the antenna 5b from the panel 2a, 2b. Alternatively, one or more of the components 5a may not be integral to the body 5c. In such an embodiment components 5a may first be connected to a panel 2a, 2b using an adhesive or epoxy, for example, and then the assembly 5 may be forcibly inserted into (e.g., snapped into) the space between each component 5a. The resisting force(s) of the components 5a are operable to hold the assembly 5 in place.

Referring to FIGS. 7A to 7D there are depicted different views of exemplary connection points between top, side and bottom components (e.g., panels) that may be used to construct an inventive enclosure 1 according to embodiments of the invention.

FIG. 7A depicts the connection of an inventive side panel 3a (or a custom made panel 3b) to an inventive top panel 2a (or to a custom made top panel 2b) and to a shielded bottom component 4 (e.g., floor). FIG. 7A includes two sections, sections "B" and "C" that are shown enlarged in FIGS. 7B and 7C. In an embodiment, the bottom component 4 may comprise one or more shielded panels, or may comprise the foundation of an existing structure, or may comprise sheet steel welded together, for example. In an embodiment, the shielded bottom component 4 may be constructed such that it is positioned on top of existing floors and may be supported by metal framing to allow antenna assemblies, such as assembly 5 described elsewhere herein, to be placed in between the existing floor and shielded panels or floor The bottom component panels may be constructed or configured in different ways depending on building requirements.

Referring to FIG. 7B, in an embodiment a prefabricated side panel 3a (or custom-made panel 3b) may be connected to the bottom component 4 using one or more joint braces 4a. In an embodiment, a brace 4a may be composed of a mild steel, for example, and may be shaped as an angular bracing component (e.g., an angle iron), for example. As indicated previously, to allow an installer to connect the side panel to the bottom component 4 or another panel, a panel 3a may be configured with an access opening 8a to allow a fastener (e.g., a bolt and nut; not shown in figures) to be adjusted (i.e., tightened) to secure the brace 4a to connect a panel to the floor (see FIG. 3C). In embodiments, because the access opening 8a provides access to both the side panel and bottom component or to two side panels connect, the panels may be positioned directly up against a wall maximizing the existing space. In embodiments, once the braces 4a have been adjusted to secure a panel to the bottom component 4 (or to another panel), an EMI shielded patch panel may be welded over the opening 8a to close the opening to prevent electromagnetic signals (e.g., a HEMP) from penetrating the enclosure 1.

Referring to FIG. 7C, in an embodiment a prefabricated top panel 2a (or custom-made panel 2b) may be constructed or connected to a side panel 3a (or 3b) using one or more roof connectors 4b. In an embodiment, a roof connector 4b may be composed of a mild steel, for example, and may be shaped as an angular bracing component (e.g., an angle iron), for example. In embodiments, the shielded layer 2d of the top panel 2a provides a substantially flat, even surface to allow the connectors 4b and panels 2a, 2b, 3a, 3b to be connected together from the interior of the layer 2d.

Referring to FIG. 7D, in an embodiment frames 3c of an inventive side panel 3a (or custom-made panel 3b) is shown constructed or connected to a roof beam 3f using one or more braces 4b to add additional bracing for the side panel 3a or top panel.

It should be understood that the enclosures, and their components as well as related methods of constructing such enclosures may preferably be stationary land-based enclosures. However, many of the features of the inventive enclosures and methods described and claimed herein may be included in, and/or applied to, movable (motorized enclosures), ship-based enclosures and/or airborne enclosures as well. Accordingly, it should be understood that such airborne or sea-based inventive enclosures include features that meet military specifications MIL-STD-4023 and/or MIL-STD-188-125-2, for example.

Further, though the enclosures described and claimed herein effectively protect against EMI (e.g., a HEMP event) it should be understood that these same enclosures may further protect users from chemical, biological, radiological, and nuclear agents or attacks.

The inventive enclosures and methods of constructing an enclosure may also be designed with software that comprises special instructions for designing and/or constructing an inventive enclosure that includes the features described herein, where the instructions may be stored in one or more electronic memories. The instructions may then be executed by one or more electronic processors to produce a design of an inventive enclosure or method constructing an inventive enclosure that includes one or more of the features described and/or claimed herein. Such software may take the form of a downloadable APP stored on an electronic, hand-held wireless or wired device or may be accessible using a browser on a hand-held device, desktop computer or laptop computer, for example.

The claim language included below is incorporated herein by reference in expanded form, that is, hierarchically from broadest to narrowest, with each possible combination indicated by the multiple dependent claim references described as a unique standalone embodiment While benefits, advantages, and solutions have been described above with regard to specific embodiments of the present invention, it should be understood that such benefits, advantages, and solutions and any element(s) that may cause or result in such benefits, advantages, or solutions, or cause such benefits, advantages, or solutions to become more pronounced are not to be construed as a critical, required, or an essential feature or element of any or all the claims appended to the present disclosure or that result from the present disclosure.

We claim:

1. An enclosure shielded to protect against electromagnetic interference (EMI) comprising:
   a plurality of first type of lightweight, self-supporting and shielded side panels and second type of lightweight self-supporting and shielded side panels conductively connected to form a contiguous side structure, wherein one or more of the first or second side panels comprises tubing;
   a plurality of first lightweight self-supporting and shielded top panels and second lightweight self-supporting and shielded top panels conductively connected to form a contiguous top structure;
   wherein each of the side panels and top panels are circumferentially welded to one another, and one or more of the first or second type of top panels comprises one or more layers, where one of the layers is an inner layer comprising an electromagnetic shielding material and another layer is an outer layer comprising a structural self-supporting material and a complex, corrugated-shaped surface to provide rigidity;
   a High-Altitude Electromagnetic Pulse (HEMP) vault; and
   one or more bottom components.

2. The enclosure as in claim 1 further comprising at least one shielded exterior door for entry into, and exit from, the enclosure from, or to, outside of the enclosure.

3. The enclosure as in claim 1 wherein the number of first type of side panels is greater than the number of second type of side panels or wherein the number of first type of top panels is greater than the number of second type of top panels.

4. The enclosure as in claim 1 wherein the enclosure comprises a stand-a-lone enclosure, or an enclosure retrofitted to an existing, non-shielded structure or a newly constructed enclosure.

5. The enclosure as in claim 1 wherein one of the first or second type of lightweight side panels weighs 165 pounds or less.

6. The enclosure as in claim 1 wherein the first or second type of side panels are composed of a mild steel, stainless steel, an aluminum, a copper or a conductive composite.

7. The enclosure as in claim 1 further comprising a system that controls an internal door and one or more external doors such that internal door (i) will not necessarily open at the same time as one of the external doors and (ii) will open at the same time as one of the external doors in case of an emergency.

8. The enclosure as in claim 1 wherein one or more of the first or second type of side panels and first or second type of top panels are composed of a copper alloy and are conductively connected using a brazing process or wherein one or more of the first or second type of side panels and first or second type of top panels are composed of a conductive composite and are conductively connected using conductive tape.

9. The enclosure as in claim 1 wherein the HEMP vault comprises one or more openings configured to allow conduits to penetrate the enclosure to provide air, power, water, or communications into the enclosure and one or more protective devices configured with each opening to prevent electromagnetic signals or fields from penetrating through such openings.

10. The enclosure as in claim 1 wherein (i) one or more of the first or second type of side and top panels comprise a corrosion protective coating or (ii) wherein one or more of the first or second type of side panels comprises an absorption layer to absorb or reduce transmission of audio signals from, or into, the enclosure and wherein one or more of the first or second type of top panels comprises an absorption layer to absorb or reduce transmission of audio signals from, or into, the enclosure, or (iii) the enclosure is coated with a fire-retardant layer.

11. The enclosure as in claim 1 wherein the first type of side panels comprise a first same size and the second type of side panels comprise a second same size, where the second size differs from the first size or wherein the first type of top panels comprise a first same size and the second type of top panels comprise a second same size, where the second size differs from the first size.

12. The enclosure as in claim 1 wherein one or more of the first or second type of side panels are rectangular in shape or curved and wherein one or more of the first or second type of top panels are rectangular in shape or curved.

13. An enclosure shielded to protect against electromagnetic interference (EMI) comprising:
   a plurality of lightweight, self-supporting and shielded side panels conductively connected to form a contiguous side structure, wherein one or more of the side panels comprises tubing;
   a plurality of lightweight self-supporting and shielded top panels conductively connected to form a contiguous top structure,
   wherein each of the side panels and top panels are circumferentially welded to one another,
   wherein one or more of the plurality of top panels comprises one or more layers, where one of the layers is an inner layer comprising an electromagnetic shielding material and another layer is an outer layer comprising a structural self-supporting material having and a complex, corrugated-shaped surface to provide rigidity; and
   one or more bottom components.

14. The enclosure as in claim 1 wherein one or more of the first or second type of side panels is configured to support the load of one or more interior components.

15. An enclosure shielded to protect against electromagnetic interference (EMI) comprising:
   a plurality of a first type of lightweight, self-supporting and shielded side panels and a plurality of a second type of lightweight self-supporting and shielded side panels conductively connected to form a contiguous side structure, wherein one or more of the side panels comprises tubing;

a plurality of a first type of lightweight self-supporting and shielded top panels and a plurality of a second type of lightweight self-supporting and shielded top panels conductively connected to form a contiguous top structure, wherein each of the side panels and top panels are circumferentially welded to one another;

wherein one or more of the first or second type of top panels comprises one or more layers, where one of the layers is an inner layer comprising an electromagnetic shielding material and another layer is an outer layer comprising a structural self-supporting material and a complex, corrugated-shaped surface to provide rigidity;

one or more bottom components;

one or more EMI antenna assemblies configured on an exterior and interior surface of one or more of the first or second type of side panels or first or second type of top panels, and wherein each of the one or more EMI antenna assemblies configured on the exterior comprises a transmitter and each of the one or more EMI antenna assemblies configured on the interior surface comprises a receiver, and further wherein the one or more EMI antenna assemblies further comprises one or more non-conductive mounting components each composed of a non-conductive material to hold a respective antenna assembly at a fixed position on the surface of a respective side or top panel and to electrically isolate the respective antenna assembly from the respective side or top panel.

16. The enclosure as in claim 15 wherein each of the one or more antenna assemblies comprising a transmitter is configured at a distance from one another of the one or more antenna assemblies configured as a transmitter and is connected to a real-time electronic monitoring, control and display subsystem.

17. The enclosure as in claim 13 wherein one or more of the side panels is configured with an access opening to allow a floor joint brace to be connected to the so configured side panel and to the bottom component and is positioned such that there is a minimally-sized gap between the bottom component and the so configured side panel and wherein one or more of the side panels is further configured with a second opening to allow a side panel frame element to be connected to the bottom component.

18. A method for protecting an enclosure against electromagnetic interference (EMI) comprising:
constructing a plurality of a first type of lightweight, self-supporting and shielded side panels and a plurality of a second type of lightweight, self-supporting and shielded side panels;
conductively connecting each of the first and second type of side panels to form a contiguous side structure, wherein one or more of the first or second type of side panels comprises tubing;
constructing a plurality of a first type of lightweight, self-supporting and shielded top panels and a plurality of a second type of lightweight, self-supporting and shielded top panels, wherein one or more of the first or second type of top panels comprises one or more layers, where one of the layers is an inner layer comprising an electromagnetic shielding material and another layer is an outer layer comprising a structural self-supporting material and a complex, corrugated-shaped surface to provide rigidity;
conductively connecting each of the top panels to form a contiguous top structure;
circumferentially welding each of the side panels and top panels to one another;
constructing a High-Altitude Electromagnetic Pulse (HEMP) vault; and
constructing one or more bottom components.

* * * * *